(12) United States Patent
Wei et al.

(10) Patent No.: US 8,372,722 B2
(45) Date of Patent: Feb. 12, 2013

(54) METHOD FOR FABRICATING A SEMICONDUCTOR DEVICE

(75) Inventors: Qingsong Wei, Beijing (CN); Yonggen He, Beijing (CN); Huanxin Liu, Beijing (CN); Jialei Liu, Beijing (CN); Chaowei Li, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/290,007

(22) Filed: Nov. 4, 2011

(65) Prior Publication Data
US 2013/0017661 A1 Jan. 17, 2013

(30) Foreign Application Priority Data

Jul. 15, 2011 (CN) .......................... 2011 1 0197911

(51) Int. Cl.
*H01L 21/336* (2006.01)
(52) U.S. Cl. ................. 438/298; 438/303; 257/E21.409
(58) Field of Classification Search .................. 438/706, 438/710, 712, 714, 719, 720, 723, 724, 733, 438/734, 739, 298, 303; 257/E21.312, E21.431, 257/E21.409
See application file for complete search history.

(56) References Cited

U.S. PATENT DOCUMENTS

| 7,303,999 | B1 * | 12/2007 | Sriraman et al. | ............... 438/719 |
| 7,579,617 | B2 * | 8/2009 | Shimamune et al. | ........... 257/19 |
| 2003/0099766 | A1 * | 5/2003 | Jurczak et al. | .................. 427/58 |
| 2006/0141398 | A1 * | 6/2006 | Shimoji et al. | ................ 430/314 |

* cited by examiner

*Primary Examiner* — Matthew Smith
*Assistant Examiner* — Wilner Jean Baptiste
(74) *Attorney, Agent, or Firm* — Innovation Counsel LLP

(57) ABSTRACT

A method of fabricating semiconductor device includes forming a recess having a substantially rectangular section and forming an oxide layer on sidewalls and an oxide layer on a bottom of the recess by anisotropic oxidation, wherein the oxide layer on the sidewalls is thinner than the oxide layer on the bottom of recess. The method further includes completely removing the oxide layer on the sidewalls and partially removing the oxide layer on the bottom of the recess. The method also includes performing an orientation selective wet etching on the recess using a remaining oxide layer of the recess as a stop layer to shape the sidewalls into a Σ shaped section. The method includes removing the remaining oxide layer using an isotropic wet etching.

21 Claims, 6 Drawing Sheets

METHOD FOR FABRICATING A SEMICONDUCTOR DEVICE

CROSS-REFERENCES TO RELATED APPLICATIONS

This application claims priority to Chinese Patent Application No. 201110197911.4, filed on Jul. 15, 2011 and entitled "Method of Fabricating a Semiconductor Device", which is incorporated herein by reference in its entirety. This application is also related to concurrently filed U.S. patent application Ser. No. 13/289,983, entitled "Method Of Fabricating A Semiconductor Device," which claims priority to Chinese Patent Application No. 201110197909.7, filed on Jul. 15, 2011 and entitled "Method of Fabricating a Semiconductor Device," all of which applications are incorporated herein by reference in their entireties.

BACKGROUND OF THE INVENTION

1. Field of the Invention

The present invention relates to a method of fabricating semiconductor devices, and more particularly, to a method of fabricating semiconductor devices including PMOS devices having embedded SiGe (eSiGe).

2. Description of the Related Art

In order to meet the demand of users for low profile electronics, in enhanced Very Large Scale Integration (VLSI) processes, stress engineering has been used to improve performance of devices. One of the effective ways is to utilize embedded SiGe (eSiGe) structures to increase hole mobility in the channel regions of a PMOS device.

In a Sigma-shaped (Σ-shaped) SiGe structure, stress in the channel regions can be effectively increased since the lattice constant of SiGe is larger than that of Si and the distance between source and drain regions is reduced by using the Σ-shaped SiGe structure.

A prior art method of forming a Σ-shaped SiGe structure in a PMOS device is shown in FIGS. 1A to 1D. After forming on a Si substrate a gate medium layer (not shown), gates are disposed on the gate medium layer, and sidewall spacers are formed on both sides of each gate as shown in FIG. 1A. Thereafter, a recess with a substantially rectangular cross section is formed between adjacent gates in the Si substrate by dry etching, as shown in FIG. 1B. For example, the substrate surface can be selected as having a (100) orientation.

Next, as shown in FIG. 1C, the recess is etched using an orientation selective wet etchant, such as an etchant containing Tetramethylammonium hydroxide (TMAH), to expand it into a recess having a Σ-shaped cross section. SiGe is epitaxially grown in the resulting Σ-shaped recess, so as to form SiGe source and drain regions, as shown in FIG. 1D.

After reviewing the prior art methods of forming Σ-shaped SiGe cross section, inventors of the present invention discovered that the conventional methods face problems of difficult epitaxial growth of SiGe and high loading effect.

In an orientation selective wet etching process shown in FIG. 1C, when using an etchant containing TMAH, for example, the etching rate in a <100> orientation is far higher than that in a (111) orientation. Thereby, with respect to a substrate for which its surface has a (100) orientation, it is very difficult to control process conditions to stop the etching before the intersection of (111) crystal planes on opposite sides of the recess (FIG. 1D). Consequently, an orientation selective wet etching tends to result in a recess with a cuspate but not a flat bottom as shown in FIG. 1E. A recess having a cuspate cross-sectional shape may have difficulties in the subsequent epitaxial growth of SiGe and result in defected semiconductor devices.

However, in VLSI fabrication processes, different areas on a substrate may have different device densities. For example, areas to be used for static random access memory (SRAM) may generally have a density higher than that of those areas to be used for logic devices. Due to the loading effect associated with wet etching, the etching in the areas with a lower device density is faster than the etching in the areas with a higher device density. Hence, when the orientation selective wet etching process mentioned above is carried out on a bulk substrate, if etching conditions are tuned on the basis of low density devices, under-etching may occur at high density devices. On the other hand, if etching conditions are tuned on the basis of high density devices, Σ-shaped recesses having cuspate bottoms as shown in FIG. 1E may occur in low density devices.

BRIEF SUMMARY OF THE INVENTION

Embodiments of the present invention provide techniques to eliminate or at least partially alleviate some or all of the problems identified above in the conventional art.

A preferred embodiment provides a method that can prevent a Σ-shaped cross-sectional recess from having a cuspate bottom. The method includes forming a recess having a substantially rectangular cross section in a substrate by dry etching, and then forming a layer of oxide on the bottom of the recess by anisotropic oxidation. The method further includes performing orientation selective wet etching on the recess using the oxide layer as a stop layer.

Embodiments of the present invention provide a method of fabricating semiconductor device. The method includes forming a recess having a substantially rectangular cross section in a substrate, performing an anisotropic oxidation process to form an oxide layer on sidewalls and an oxide layer on a bottom of the recess, wherein the oxide layer on the sidewalls of the recess is thinner than the oxide layer on the bottom of the recess, and performing a first isotropic wet etching process to completely remove the oxide layer on the sidewalls of the recess and partially remove the oxide layer on the bottom of the recess. The method further includes performing an orientation selective wet etching on the recess using a remaining oxide layer on the bottom of the recess as a stop layer to shape the sidewalls of the recess into a Σ-shaped cross section, and performing a second isotropic wet etching process to remove the remaining oxide layer on the bottom of the recess.

In one embodiment, the anisotropic oxidation process is performed by a dry oxidation process while applying a bias voltage to the substrate.

In one embodiment, oxygen ions are applied to the recess in a direction substantially parallel to the sidewalls of the recess in the anisotropic oxidation process.

In one embodiment, a thickness of the oxide layer on the bottom of the recess resulted from the anisotropic oxidation process ranges from about 5 Å to about 100 Å.

In one embodiment, a thickness of the oxide layer on the sidewalls of the recess resulted from the anisotropic oxidation process ranges from 3 Å to 10 Å.

In one embodiment, a thickness of the oxide layer on the bottom of the recess after the first isotropic wet etching process ranges from 2 Å to 97 Å.

In one embodiment, the first isotropic wet etching process is performed by removing the oxide layer using an HF solution or an HF vapor.

In one embodiment, the second isotropic wet etching process is performed by removing the oxide layer using an HF solution or an HF vapor.

In one embodiment, the step of forming a recess having a substantially rectangular cross section in the substrate comprises performing a dry etching process.

In one embodiment, the step of forming a recess having a substantially rectangular cross section in the substrate comprises forming a gate medium layer on the substrate, forming a plurality of gates on the gate medium layer, forming a top mask layer on a top surface of the gates, forming sidewall spacers on sides of each of the gates, and performing a dry etching process on the substrate using the top mask layer and the sidewall spacers as a mask to form the recess between two adjacent gates.

In one embodiment, the step of performing orientation selective wet etching on the recess comprises performing a wet etching process on the recess with Tetramethylammonium hydroxide (TMAH) having a 10% to 25% mass concentration and at a temperature of about 70° C. to about 90° C.

In one embodiment, the etching rate of the orientation selective wet etching in a <100> orientation is higher than that in a <111> orientation.

In one embodiment, the gates formed on the substrate comprise polysilicon.

In one embodiment, the method further comprises performing epitaxial growth of SiGe in the recess after the oxide layer on the bottom of the recess has been removed by the second isotropic wet etching.

In one embodiment, the method further comprises performing ion implantation on the substrate to form source and drain regions before performing dry etching on the substrate.

In one embodiment, the method further comprises performing ion implantation on the substrate to form source and drain regions after performing the epitaxial growth of SiGe in the recess.

In one embodiment, the method further comprises forming a mask on top of areas to be formed as NMOS devices and exposing areas to be formed as PMOS devices before performing dry etching on the substrate.

Through forming an oxide layer on the bottom of the recess, which may be used as a stop layer in a subsequent orientation selective wet etching, the disclosed method of the present invention can prevent a cuspate from forming at the bottom of the Σ-shaped recess.

In some embodiments of the present invention, the depth of the resulting Σ-shaped recess is primarily determined by the dry etching, and therefore the disclosed method can achieve a relatively low loading effect value. In an embodiment, the loading effect value ranges from about 1% to about 5%.

Features, advantages, and benefits of the present invention will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate some embodiments of the invention and, together with the description, serve to explain the principles of the invention. The same reference labels in various drawings will refer to the same parts or steps.

The present invention can be more clearly understood from the following detailed description with reference to the drawings, wherein:

FIG. 1A shows that gates are formed on a substrate, and sidewall spacers are formed on both sides of the gates;

FIG. 1B shows a recess having a substantially rectangular cross section is formed in the substrate between two adjacent gates;

FIG. 1C shows that the rectangular cross section of recess obtains a Σ shape with an orientation selective wet etching;

FIG. 1D shows the epitaxial growth of SiGe in the Σ-shaped recess to form SiGe source and drain regions;

DETAILED DESCRIPTION OF THE INVENTION

Figure 1A:
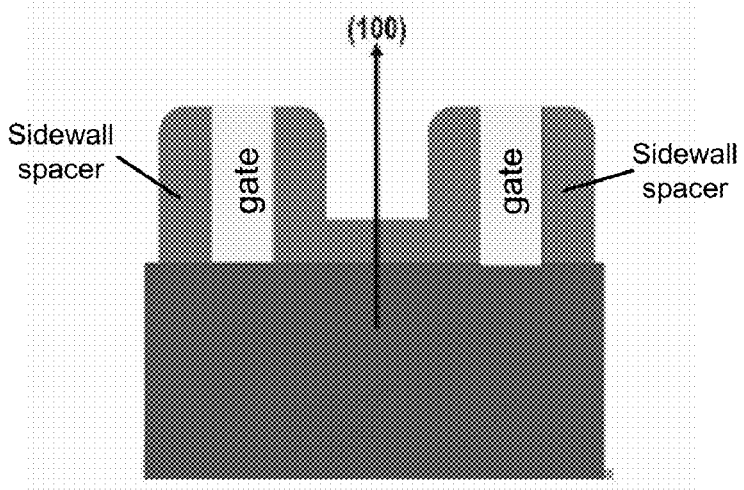
FIGS. 1A to 1D are cross-sectional views illustrating steps of forming Σ-shaped SiGe recess in a PMOS device, as known in the prior art.
Figure 1B:
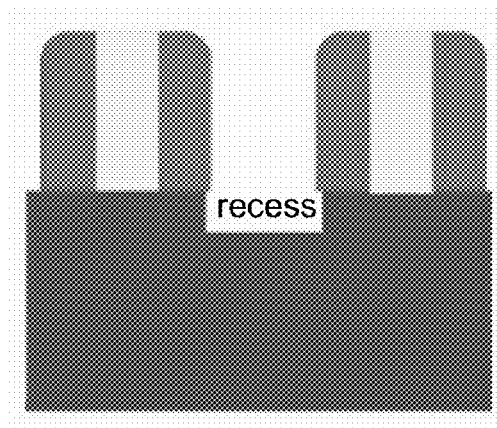
Figure 1C:
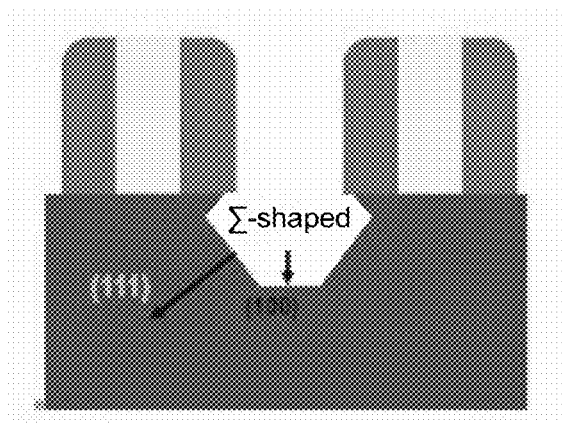
Figure 1D:
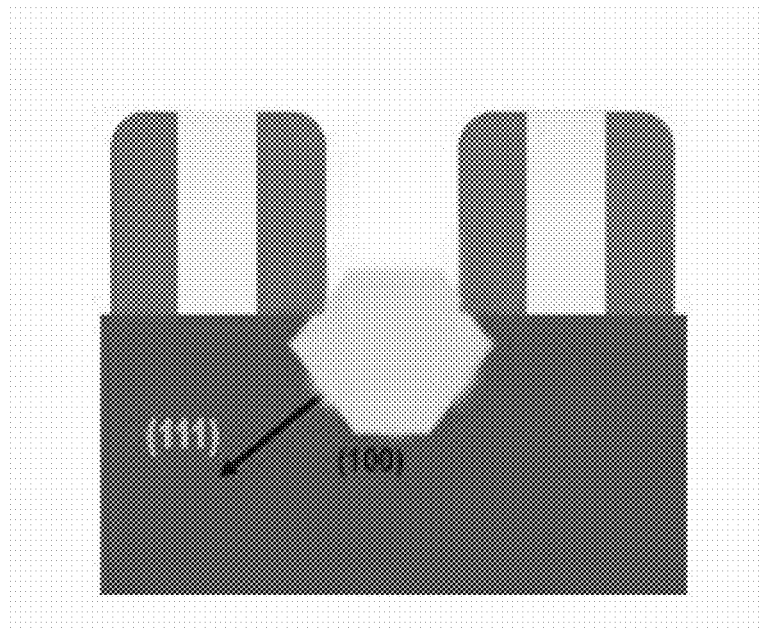
Figure 1E:
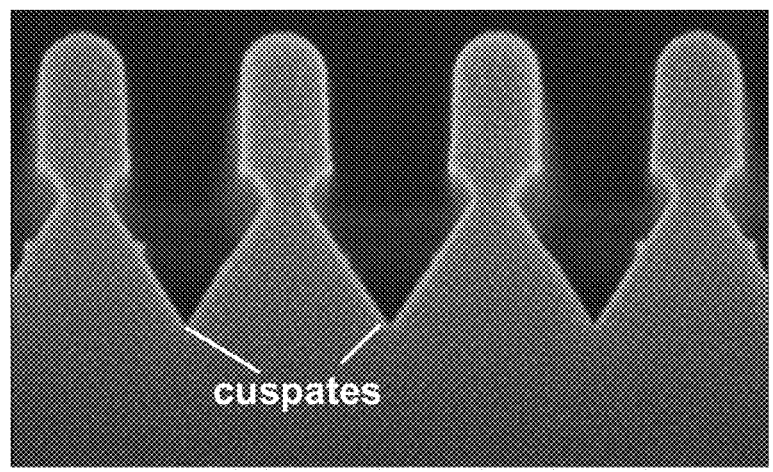
FIG. 1E shows the recess having a cuspate bottom formed in the substrate resulted from orientation selective wet etching.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

It should be appreciated that, for the convenience of description, various parts shown in the figures are not illustrated in actual proportion.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the mandated specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it will not be further discussed or explained in following figures.

In some embodiments of the present invention, the formation of a Σ-shaped recess in a substrate may include three steps: (1) forming a recess having a substantially rectangular cross section between two adjacent gates in a substrate by dry etching process, (2) forming an oxide layer on the sidewalls and an oxide layer on the bottom of the recess by an anisotropic oxidation process, wherein the oxide layer formed on the sidewalls of the recess is thinner than the oxide layer formed on the bottom of the recess, and completely removing the oxide layer on the sidewalls of the recess by an isotropic wet etching process while only partially removing a portion of the oxide layer on the bottom of the recess remains, and (3) performing an orientation selective wet etching using a remaining oxide layer on the bottom of the recess as a stop layer to transform the rectangular cross-sectional shaped recess into a Σ-shaped cross-sectional recess, and removing the remaining oxide layer on the bottom of the recess by an isotropic wet etching process.

Figure 2:
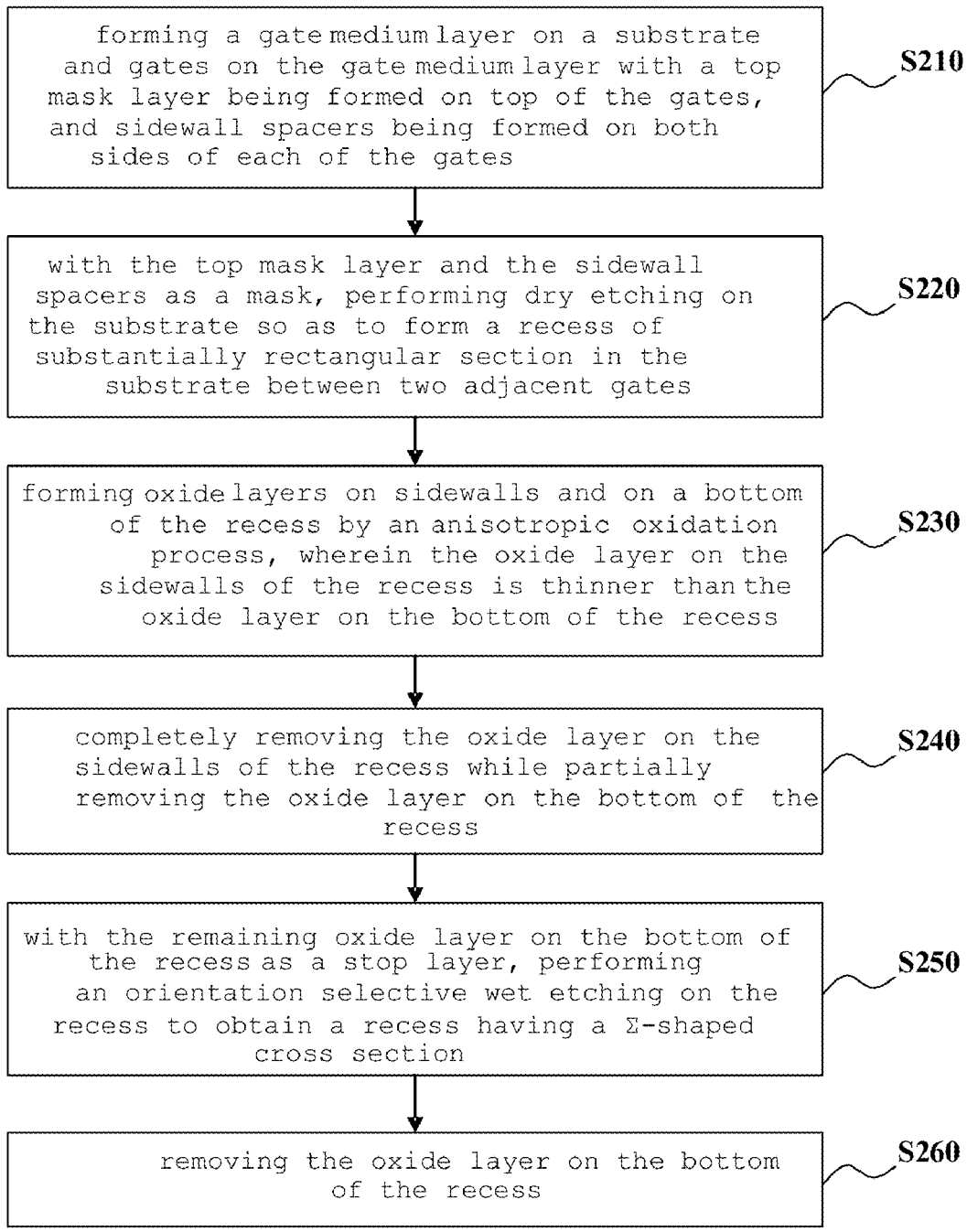
FIG. 2 schematically shows a flowchart of a method of forming a Σ-shaped recess in a PMOS device according to one embodiment of the disclosure.

FIG. 2 schematically shows a flowchart of a method 200 of forming a Σ-shaped recess in a substrate of a PMOS device according to one embodiment of the disclosure. The method 200 begins at S210 that includes forming a gate medium layer on a substrate, forming one or more gates on the gate medium layer, forming a top mask layer on a top surface of the gates, and forming sidewall spacers on the sides of each of the gates.

Next, at S220, the substrate is dry etched using the top mask layer and the sidewall spacers as a mask, so as to form a recess in the substrate between two adjacent gates. At S230, the method further includes forming an oxide layer on sidewalls and an oxide layer on a bottom of the recess by an anistropic oxidation process, wherein the oxide layer on the sidewalls is thinner than the oxide layer on the bottom of the recess. At S240, the oxide layer on the sidewalls is completely removed while the oxide layer on the bottom of the recess is only partially removed so that a remaining portion of the oxide layer covers the bottom of the recess. At S250, with the remining oxide layer as a stop layer, the method includes performing an orientation selective wet etching to the recess to obtain a recess having a sigma-shaped cross section. The method further includes removing the remaining oxide layer on the bottom of the recess at S260.

Figure 3A:
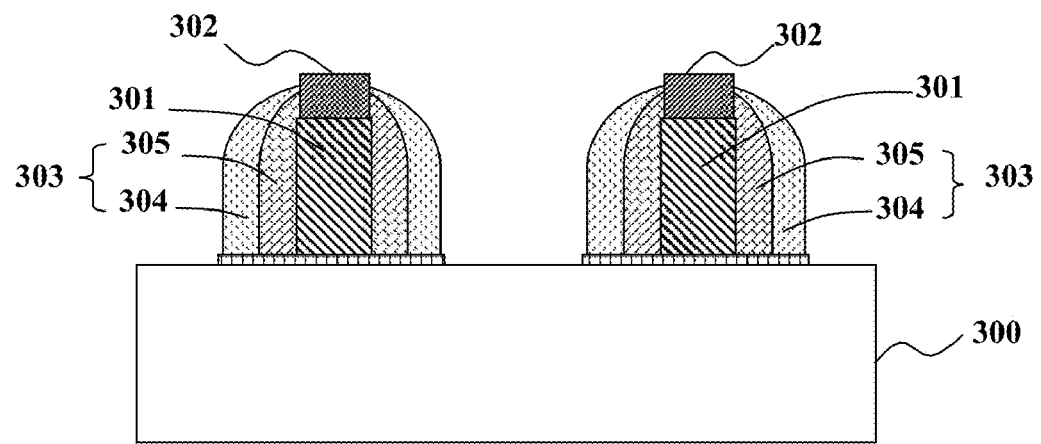
FIGS. 3A to 3F schematically show cross-sectional views of various steps of the method of forming the Σ-shaped recess in FIG. 2.

FIGS. 3A to 3F are cross-sectional views illustrating the steps described in FIG. 2. According to an embodiment of the present invention, the structure shown in FIG. 3A is formed using any suitable process. In an example embodiment, a gate medium layer 310 is formed over a substrate 300, one or more gates 301 are formed on the gate medium layer, a top mask layer 302 is formed on a top surface of the gates, and sidewall spacers are formed on the sides of each gate.

In an embodiment, the substrate may be made of silicon. The gate medium layer may be silicon oxide. The gate in the present embodiment may be, for example, polysilicon gate. The top mask layer 302 and the sidewall spacers 303 are used to protect the gate 301 in subsequent dry etching, wet etching, and ion implantation processes to form source/drain regions. The top mask layer 302 may be, for example, silicon nitride. In an embodiment, the sidewall spacers 303 may include offset spacers 305 that are formed directly on the sides of the gates and main spacers 304 that are formed over the offset spacers 305. In an embodiment, main spacers 304 may include silicon nitride, and the offset spacers 305 may include silicon oxide.

Figure 3B:
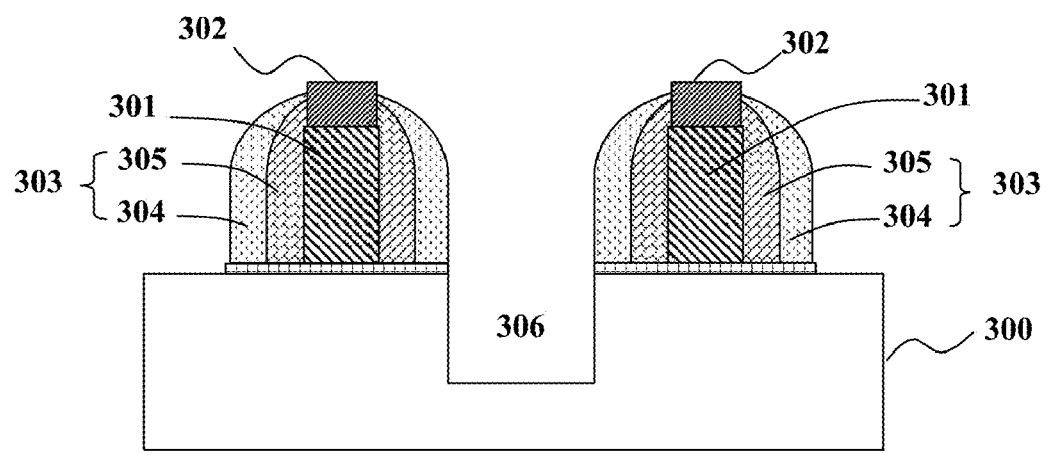

Turning to FIG. 3B, a region of the substrate 300 disposed between two adjacent gates is dry etched using the top mask layer 302 and the sidewall spacers 303 as a mask to form a recess 306. In an embodiment, the recess 306 has a substantially rectangular cross section. In an embodiment, the dry etching can adopt HBr or $Cl_2$ as main reactive gases.

It should be noted that although the substantially rectangular recess formed in the substrate between two adjacent gates is illustrated in the present embodiment, the recess can also be formed in other areas of the substrate, for example, in the area between a shallow trench isolation structure and a gate.

In addition, it should be noted that although the recess 306 is illustrated in FIG. 3B as having a substantially rectangular cross section, recesses with other sectional shapes are possible, such as a "U" shaped cross section.

Figure 3C:
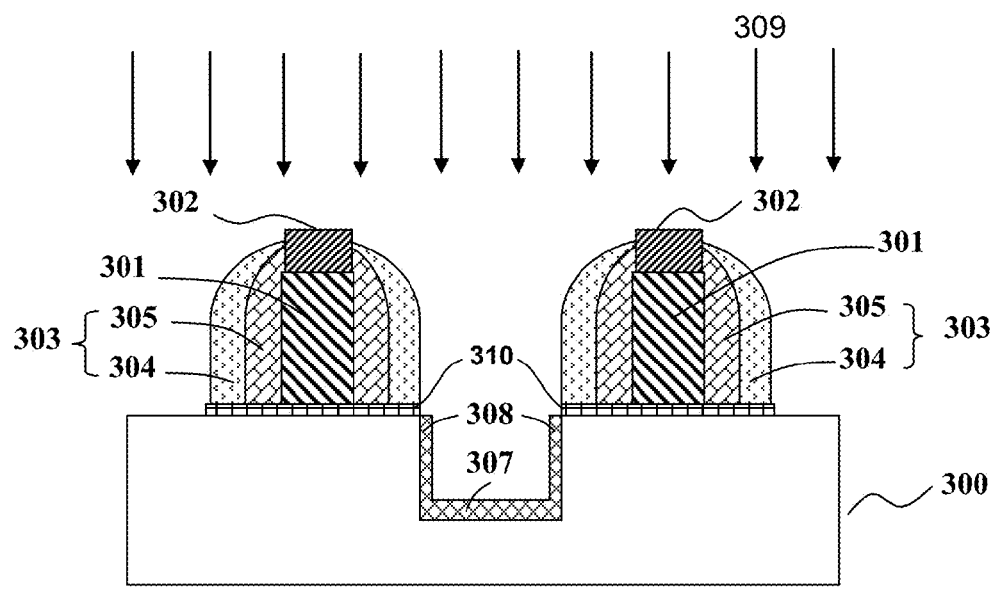

Referring next to FIG. 3C, an anisotropic oxidation process is performed to form an oxide layer 307 on the bottom of the recess and an oxide layer 308 on the sidewalls of the recess. The oxide layers 307, 308 may be silicon oxide layers. As shown in FIG. 3C, the oxide layer 308 on the sidewalls of the recess is thinner than the oxide layer 307 on the bottom of the recess. In one embodiment, the oxide layer 307 on the bottom of the recess may have a thickness of about 5 Å to about 100 Å, and the oxide layer 308 on the sidewalls of the recess may have a thickness of about 3 Å to about 10 Å.

In an embodiment, the anisotropic oxidation process is performed by dry oxidation while a bias voltage is applied to the substrate 300. In an example embodiment, as shown in FIG. 3C, the bias voltage applied to the substrate 300 is controlled, such that oxygen ions are applied to the recess 306 in a direction substantially parallel to the sidewalls of the recess 306, as indicated by the arrow 309. In an embodiment, since oxygen ions are applied in a direction that is substantially parallel to the vertical sidewalls of the recess 306, oxidation essentially occurs on the bottom of the recess, and thus the oxide layer 307 formed on the bottom of the recess is much thicker than the oxide layer 308 formed on the sidewalls of the recess. In other embodiments, other anisotropic oxidation processes other then applying a bias voltage can be utilized, as long as the oxide layer formed on the sidewalls of the recess is thinner than the oxide layer formed on the bottom of the recess.

Figure 3D:
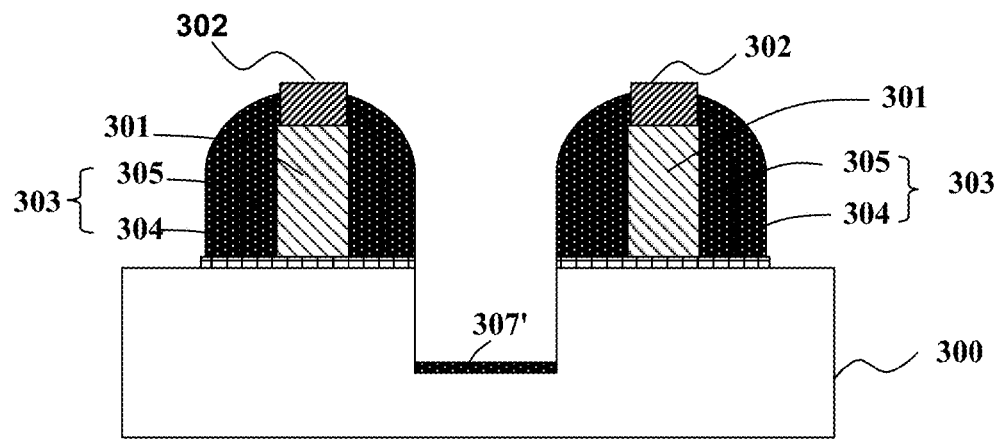

Next, by using an isotropic wet etching such as using an HF solution or an HF vapor, or other oxide removing processes that are well known in the art, the oxide layer 308 on the sidewalls of the recess is completely removed and the oxide layer 307 on the bottom of the recess is partially removed so that a thinner oxide layer 307' is remaining, as shown in FIG. 3D. For example, in the case that the oxide layer 307 formed on the bottom of the recess at S230 has a thickness of about 5 Å to about 100 Å, the remaining oxide layer 307' on the bottom of the recess after the wet etching at step S240 can have a thickness of about 2 Å to about 97 Å.

Figure 3E:
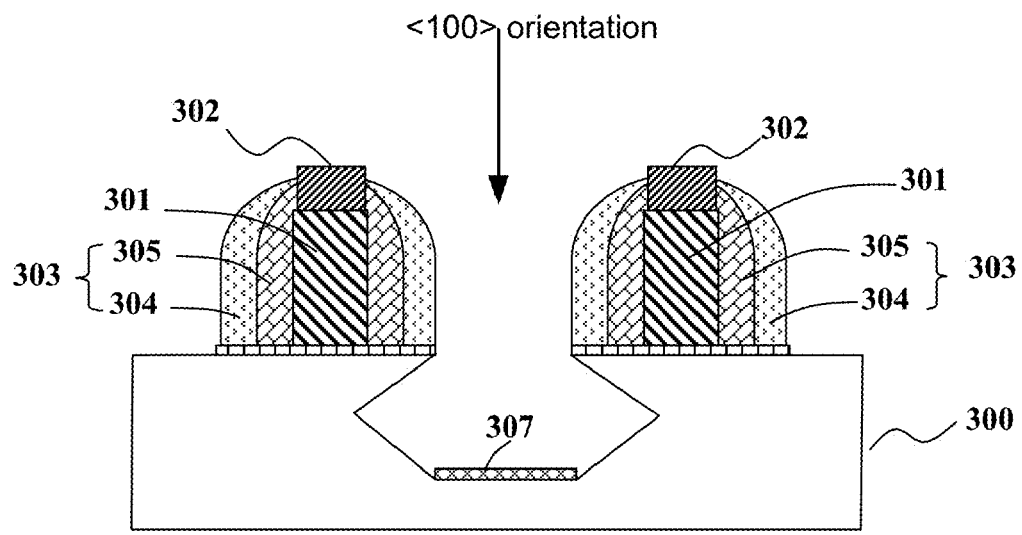

Thereafter, using the remaining oxide layer 307' on the bottom of the recess as a stop layer, the recess 306 is subject to an orientation selective wet etching to remove a part of the inner walls of the recess 306 so that the recess obtains a Σ-shaped cross section, as shown in FIG. 3E. In one embodiment, the orientation selective wet etching can be performed with Tetramethylammonium hydroxide (TMAH) having 10% to 25% mass concentration at a temperature of 70° C. to 90° C.

The oxide layer 307' may act as a stop layer so that the etching in the <100> orientation is stopped in the orientation selective wet etching process. As a result, the Σ-shaped recess having a cuspate bottom can be avoided. Furthermore, the depth of the resulting Σ-shaped recess is primarily determined by the dry etching at step S220, and therefore, the method of the present invention provide a satisfied loading effect value. In the present invention, the term "loading effect value" is defined as the ratio of etching depths or the ratio of etch rates in different device areas of a same substrate. In the present embodiment, the loading effect value may range from about 1% to about 5%.

Figure 3F:
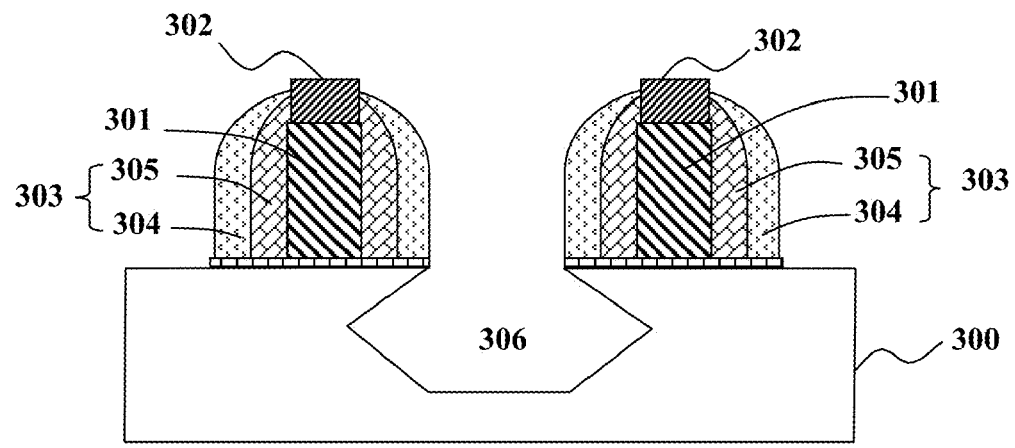

FIG. 3F shows a cross-sectional view of the next stage of one embodiment of the present invention. The oxide layer 307 on the bottom of the recess is removed by an isotropic wet etching, so as to form a Σ-shaped recess 306' to be used for a subsequent epitaxial growth of SiGe, as shown in FIG. 3F. In one embodiment, the above-mentioned wet etching can be performed by using an HF solution or HF vapor, or other well-known processes to remove silicon oxides.

It should be noted that, before the dry etching in the substrate (i.e., step S220 of FIG. 2) or after epitaxial growth of SiGe in the recess, ion implantation can be performed in the substrate to form source and drain regions.

It should be noted that, eSiGe structures functioning as source/drain regions generally work in PMOS transistors. Thereby, with respect to semiconductor devices having both PMOS and NMOS transistors, it is necessary to shield the portions of NMOS transistors with a mask or the like during the formation of Σ shaped recesses for PMOS transistors.

By forming a silicon oxide layer on the bottom of the recess, which is used as a stop layer in the subsequent orientation selective wet etching, the method of the present invention can prevent a cuspate bottom from forming in a Σ-shaped recess and can obtain a lower loading effect value.

Thus, the method of fabricating semiconductor device has been described in detail according to embodiments of the present invention. Some details that are well known in the art are not discussed for the purpose of not obscuring the concept of the present invention. From the above description, those skilled in the art can thoroughly understand how to implement the technique solutions disclosed herein.

Although some specific embodiments of this disclosure of invention have been illustrated in detail by way of examples, those skilled in the art will appreciate in light of the foregoing that the above examples are merely illustrative and are not intended to limit the scope of teachings regarding the disclosed invention. It should be understood by a person skilled in the art that the above embodiments can be modified without departing from the scope and spirit of the present teachings.

What is claimed is:

1. A method of fabricating a semiconductor device, comprising the following steps:
    forming in a crystalline silicon (Si) substrate having a horizontal upper surface with a <100> orientation, a recess having sidewalls extending downward from the upper surface and having a horizontal bottom;
    performing an anisotropic oxidation on the substrate having the recess to thereby form a first oxide layer having a first thickness on the sidewalls and a second oxide layer having a second thickness on the bottom of the recess, wherein the second thickness is greater than the first thickness;
    performing a first isotropic wet etching on the oxidized substrate which completely removes the first oxide layer on the sidewalls of the recess and only partially removes the second oxide layer on the bottom of the recess thereby leaving the bottom of the recess covered by a remaining part of the second oxide layer;
    performing an orientation selective wet etching on the recess while using the remaining part of the second oxide layer on the bottom of the recess as an etch stop layer to thereby obtain a Σ-shaped cross section for the recess wherein the Σ-shaped cross section includes a horizontally extending bottom due to the etch stop function of the remaining part of the second oxide layer; and
    after obtaining the Σ-shaped cross section, performing a second isotropic wet etching process to remove the remaining part of the second oxide layer and thus expose a horizontally extending Si bottom surface at the bottom of the recess.

2. The method according to claim 1, wherein performing the anisotropic oxidation comprises a dry oxidation with a bias voltage applied to the substrate.

3. The method according to claim 1, wherein performing the anisotropic oxidation comprises applying oxygen ions to the recess in a direction substantially parallel to the downward extending sidewalls of the recess.

4. The method according to claim 1, wherein the second oxide layer on the bottom of the recess has a thickness ranging from about 5 Å to about 100 Å.

5. The method according to claim 1, wherein the first oxide layer on the sidewalls of the recess has a thickness ranging from about 3 Å to about 10 Å.

6. The method according to claim 1, wherein the remaining part of the second oxide layer on the bottom of the recess has a thickness ranging from about 2 Å to about 97 Å after the first isotropic wet etching.

7. The method according to claim 1, wherein performing the first isotropic wet etching comprises using an HF solution or an HF vapor.

8. The method according to claim 1, wherein performing the second isotropic wet etching comprises using an HF solution or an HF vapor.

9. The method according to claim 1, wherein the forming of the recess having the sidewalls extending downward from the upper surface comprises:
    performing a dry etching to form the recess having a substantially rectangular cross-sectional shape in the substrate.

10. The method according to claim 1, and further comprising, prior to forming the recess:
    forming a gate medium layer on the substrate;
    forming one or more gates on the gate medium layer;
    forming a top mask layer on a top surface of the gates;
    forming sidewall spacers on both sides of each gate; and
    wherein the forming of the recess comprises: performing a dry etching on the substrate while using the formed top mask layer and the sidewall spacers as an etch mask.

11. The method according to claim 10, wherein the gates comprises polysilicon.

12. The method according to claim 10, wherein the top mask layer comprises silicon nitride.

13. The method according to claim 10, wherein each of the sidewall spacers comprises:
    an offset spacer formed on sides of the corresponding gate, the offset spacer including silicon oxide; and
    a main spacer formed on the offset spacer, the main spacer including silicon nitride.

14. The method according to claim 1, wherein performing the orientation selective wet etching on the recess comprises using Tetramethylammonium hydroxide (TMAH) having a 10% to 25% mass concentration and at a temperature of about 70° C. to about 90° C.

15. The method according to claim 1, wherein performing the orientation selective wet etching comprises an etching rate in a <100> orientation being higher than an etching rate in a <111> orientation.

16. The method according to claim 1, wherein performing the orientation selective wet etching comprises a loading effect value ranging from about 1% to about 5%.

17. The method according to claim 1 further comprising:
    performing epitaxial growth of SiGe in the Σ-shaped cross-sectional recess after the remaining oxide layer on the bottom of the recess has been removed.

18. The method according to claim 17 further comprising:
    performing ion implantation on the substrate to form source and drain regions after performing the epitaxial growth of SiGe.

19. The method according to claim 1 further comprising:
    performing ion implantation on the substrate to form source and drain regions before performing the dry etching on the substrate.

20. The method according to claim 1 further comprising:
    forming a mask on top of areas to be formed as NMOS devices and exposing areas to be formed as PMOS devices before performing the dry etching on the substrate.

21. The method of claim 1 wherein the Σ-shaped cross section obtained for the recess includes a <111> oriented face.

* * * * *